United States Patent [19]

Mathews et al.

[11] Patent Number: 4,968,150
[45] Date of Patent: Nov. 6, 1990

[54] PROCESS AND ARRANGEMENT FOR MEASURING THE ENERGY OF A MICROWAVE PULSE

[75] Inventors: Hans-Gunter Mathews, Oberehrendingen; Oskar Schafheitle, Oewil, both of Switzerland

[73] Assignee: Asea Brown Boveri Ltd., Baden, Switzerland

[21] Appl. No.: 317,842

[22] Filed: Mar. 2, 1989

[30] Foreign Application Priority Data

Mar. 2, 1988 [CH] Switzerland .................. 756/88

[51] Int. Cl.$^5$ .................................. G01K 17/00
[52] U.S. Cl. ............................. 374/32; 324/95; 324/106; 374/33
[58] Field of Search ............. 374/31, 32, 33, 34; 324/95, 106

[56] References Cited

U.S. PATENT DOCUMENTS

| 2,451,724 | 10/1948 | Evans | 324/95 |
|---|---|---|---|
| 2,846,647 | 8/1958 | MacPherson | 324/95 |
| 2,850,702 | 9/1958 | White | 324/95 |
| 2,853,679 | 9/1958 | Nelson | 324/95 |
| 3,040,252 | 6/1962 | Novak | 324/95 |
| 3,143,703 | 8/1964 | Kraeuter | 324/95 |
| 3,487,685 | 1/1970 | Shifrin | 374/32 |
| 3,670,570 | 6/1972 | Briones | 374/32 |
| 4,223,264 | 9/1980 | Yamamura et al. | 324/95 |
| 4,593,259 | 6/1986 | Fox et al. | 333/22 F |

FOREIGN PATENT DOCUMENTS

| 362248 | 2/1973 | U.S.S.R. | 324/106 |
|---|---|---|---|
| 682836 | 8/1979 | U.S.S.R. | 324/95 |
| 839992 | 6/1960 | United Kingdom | 324/95 |
| 1009163 | 11/1965 | United Kingdom | 324/95 |
| 2144275 | 2/1985 | United Kingdom | |
| 2189029 | 10/1987 | United Kingdom | 324/95 |

OTHER PUBLICATIONS

Clogston, Abstract of Ser. No. 608291, Filed Aug. 1, 1945, Published in O. G. on 9/12/1950.
Meahl, Abstract of Ser. No. 706894, Filed Oct. 31, 1946, Published in O. G. on 9/26/1950.
Scott, B. F., "Laser Energy Measurements with a Liquid Absorption Cell," J. Sci. Instrum. vol. 43, pp. 940-942, (1966).
"Calorimetric Measurements of Single-Pulse High-Power Microwaves in Oversized Waveguides," Review of Scientiic Instruments, vol. 57, No. 5, May 1986, pp. 855-858.
American Institute of Physics (Woodbury, New York, US) C. B. Wharton "Calorimetric Measurements of Laser Energy and Power", Journal of Physics E; Scientific Instruments, vol. 6, No. 2, Feb. 1973 (GB) S. R. Gunn, pp. 105-114.

Primary Examiner—William A. Cuchlinski, Jr.
Assistant Examiner—Diego F. F. Gutierrez
Attorney, Agent, or Firm—Oblon, Spivak, McClelland, Maier & Neustadt

[57] ABSTRACT

In an arrangement for measuring the energy of a microwave pulse a container (2) is placed on the end of a waveguide (1). In container (2) there is an absorption liquid (3) with a given heat content, which absorbs the energy of the irradiated microwave pulse. The increase of the heat content thus caused which corresponds to the energy of the microwave pulse is determined by the volume expansion of the absorption liquid (3). For this purpose container (2) is connected to a capillary (4). Preferably container (2) is covered with a reflection layer (12). Further, it is additionally connected to a balancing volume (5) and is cooled with a cooling coil (14).

9 Claims, 1 Drawing Sheet

PROCESS AND ARRANGEMENT FOR MEASURING THE ENERGY OF A MICROWAVE PULSE

TECHNICAL FIELD

The invention relates to a process and an arrangement for measuring the energy of a microwave pulse, in which the microwave pulse is irradiated into an absorption liquid with a given heat content so that it absorbs at least a part of the energy of the microwave pulse and the energy of the microwave pulse is determined from an increase of the heat content.

PRIOR ART

In view of controlled nuclear fusion, high-power microwave engineering is very important in the range of some few to some 100 GHz. Looked at from the measuring technique viewpoint, in this case measuring of energy or power of a microwave pulse represents a problem. Today calorimetric measuring processes are mostly used for this purpose. The characteristic features of such measuring processes are described, e.g., in the book "Mikrowellen Messtechnik" [Microwave Measuring Technique], Horst Groll, Friedrich Vieweg & Sohn, Braunschweig.

A so-called high-power calorimeter for high-frequency microwaves is known, e.g., from U.S. Pat. No. 4,593,259. An absorption liquid, which is circulated by a pump, is in a metal container. The temperature of the absorption liquid and the flow are measured at a container outlet. The container and liquid are warmed by the irradiated and absorbed microwave power. The absorbed power, or if it is integrated over time, the absorbed energy can be determined from the flow and increase of temperature.

But such a high-power calorimeter is not suitable for measuring individual microwave pulses. With slight absorbed energy in partilcular the temperature increase in the absorption liquid is too small even to be detected.

DESCRIPTION OF THE INVENTION

Therefore the object of the invention is to provide a process for measuring an energy of a microwave pulse, in which the microwave pulse is irradiated into an absorption liquid with a given heat content so that it absorbs at least a part of the energy of the microwave pulse, and the energy of the microwave pulse is determined from an increase of the heat content, which is suitable for measuring slight energies. The object of the invention is also to indicate an arrangement for performing such a process.

A process according to the invention is distinguished by the fact that the increase of the heat content is determined by means of a measurement of a volume expansion.

Preferably the absorption liquid as a whole is maintained at a substantially constant working temperature. A nongassing oil is preferably used as absorption liquid.

An arrangement according to the invention comprises a container filled with an absorption liquid, which exhibits at least one high frequency (HF) window and is connected to a capillary.

Preferably the container is configured so that the irradiated energy of the microwave pulse is distributed over the entire absorption liquid.

Other preferred embodiments of the invention follow from the subclaims.

BRIEF DESCRIPTION OF THE DRAWING

The invention is explained in greater detail below by means of the embodiments and in connection with the drawing. There are shown in.

WAYS FOR EMBODYING THE INVENTION

Figure 1:
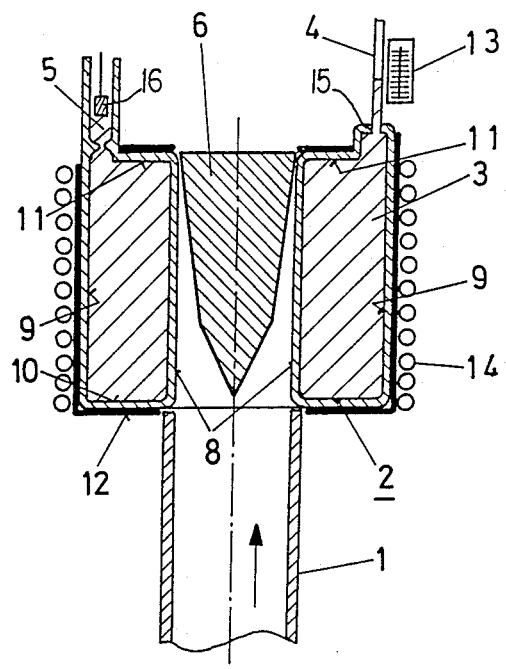
FIG. 1, a section through an arrangement with a reflection cone.

FIG. 1 shows a section through a preferred arrangement for performing a process according to the invention.

The arrangement according to the invention is placed on one end of a waveguide 1 coaxial with it. It comprises a container 2, which is filled with an absorption liquid 3, a capillary 4 and a balancing volume 5, both of which are connected to container 2. Further, according to a preferred embodiment container 2 exhibits a reflection cone 6.

Container 2 has the shape of a cylindrical jacket, i.e., a volume of container 2 is limited by a cylindrical inside wall 8, a cylindrical outside wall 9 placed coaxial with it, and an annularly formed bottom 10 and a corresponding cover 11, which in combination close the volume in axial direction. The diameter of the inside wall essentially corresponds to the diameter of waveguide 1.

Container 2 consists, e.g., of quartz or glass, and has a wall thickness, which preferably is smaller than $\frac{1}{4}$ of a wavelength of an irradiated microwave pulse. In this way, it can be achieved that container 2 is transparent to the microwave pulse.

Reflection cone 6 has the object of dispersing the microwave pulse so that its energy is distributed as uniformly as possible over the volume of container 2, and thus over absorption liquid 3. For this purpose, it generally will be absolutely necessary to design its shape especially for the microwave pulse, i.e., a directed mode of waveguide 1. In FIG. 1 reflection cone 6 is made in two stages according to a preferred embodiment. At its pointed end the cone 6 has a greater angle of inclination than at its base.

Outside wall 9, bottom 10 and cover 11 of container 2 are covered with a reflection layer 12, which prevents a yet unabsorbed part of the microwave pulse dispersed by reflection cone 6 from going outside the container.

Inside wall 8 acts as a HF window. Of course, as much as possible it should let the dispersed microwave pulse pass unimpaired. But it will not be possible to prevent a part of the microwave pulse from being reflected by the inside wall 8 and again dispersed by the reflection cone 6. By a suitably selected shape of this reflection cone 6, such to-and-fro reflections can and should be reduced to a minimum.

In this embodiment the capillary 4 is fastened to the cover 11 of the container 2. A rise of the absorption liquid 3 in the capillary 4 can, e.g., be read on a scale 13. The purpose of the balancing volume 5 is to adjust the height of the liquid 3 in the capillary 4 prior to measurement. This possiblility of changing the balancing volume with a flask and a piston 16 is indicated in FIG. 1.

To increase the measuring exactness, container 2 is advantageously kept at a constant working temperature. For this purpose, e.g., it can be enveloped by a cooling coil 14, which keeps the arrangement from being warmed above ambient temperature. Thus disturbing radiation or irradiation effects can be prevented.

The mode of operation of the described arrangement is obvious.

A microwave pulse (see arrow), which travels in waveguide 1, strikes reflection cone 6 and is dispersed in the radial direction. A large part of the microwave pulse enters through the inside wall 8, i.e., the HF window, into container 2, where it is absorbed by the absorption liquid 3. Generally, a smaller part of the microwave pulse will be reflected by the inside wall 8 and then by the reflection cone 6 and thus will enter container 2 only in the second or third attempt.

Because of the absorbed energy of the microwave pulse, the absorption liquid 3 warms at least locally and expands correspondingly. Such a thermal volume expansion is measured with capillary 4.

Some details of the process or arrangement according to the invention are to be discussed below.

Special attention is to be directed to absorption liquid 3. On the one hand, it is to absorb well in a given wavelength range but, on the other hand, it must not develop gas. If gas bubbles form because of local excess heating, the thermal volume expansion of absorption liquid 3 as a whole to a high degree is not linear. The rise in capillary 4 can no longer clearly indicate an increase of the heat content, i.e., the absorbed energy. In practice, a gassing absorption liquid 3 leads to a rise overshooting.

To avoid these difficulties, preferably, e.g., hydraulic oils or vacuum oils are used as absorption liquid 3. These are known for having only a slight inclination to gassing.

Another step consists in using an absorption liquid 3 in which the microwave pulse has a great penetration depth. In a given volume element less energy is then absorbed, which reduces the danger of local overheating.

The thickness of container 2 is advantageously so dimensioned (i.e., redial distance of outside wall 9 from inside wall 8) that the dispered microwave pulse has run its course not later than after the second passage through the container, i.e., after a reflection on reflecting outside wall 9 has again reached inside wall 8.

A great advantage of the invention resides in the fact that the measurement requires no thermal equilibrium. As long as the thermal volume expansion increases linearly with the increase of the heat content or of the absorbed energy, it does not matter for the rise whether a small part of absorption liquid 3 locally warms relatively strongly or a correspondingly large part warms only slightly.

This fact can be used if the volume of container 2 is kept large. Such a step results in the equilibruim temperature of absorption liquid 3 after absorption of a microwave pulse differing only slightly from the equilibrium temperature before the absorption (working temperature). Disturbing effects such as, e.g., thermal radiation or emission of heat by the outside wall, can not even get started.

A numerical example will explain what has been said. For a microwave pulse with an energy of about 10 J the volume of the absorption liquid should be about 1-2 liters. At a specific heat of about 2.1 J/gK an increase of the equilibrium temperature of about 1/400 K results. The equilibrium temperature after absorption of the energy is thus negligibly small relative to the working temperature.

But the volume of the absorption liquid is also important in connection with stabilizing the working temperature. Cooling coil 14, e.g., should keep the working temperature constant, i.e., to dissipate the absorbed energy, but it must not be done so quickly that the measurement is impaired as a result. If not the energy largely inside container 2 and not near outside wall 9 is converted into heat, it generally takes several seconds until the fed heat, because of heat conduction, is dissipated by outside wall 9. In practice this suffices to determine the final value of the rise.

Another drawback to be prevented is the thermal expansion of container 2. This depends, on the one hand, how greatly container 2 is warmed of the microwave pulse passing through and, on the other hand, on how great its expansion coefficient is. Therefore in view of a slight expansion coefficient it is advantageous to use a container made of quartz. A possibility more favorable in cost consists in selecting a glass with a high transparency for the microwave pulse that is to be measured. In any case, it is good to keep the walls of container 2 as thin as possible.

Of course, when pouring absorption liquid 3 into container 2, attention is to be paid that no air or gas is trapped, which hinders the correct mode of operation of the arrangement.

If capillary 4 is interchangeably attached, the arrangement can be changed over very quickly for microwave pulses of high energy, e.g., by use of a larger capillary 4. The rise can be equalized in each case with the help of balancing volume 5.

If absorption liquid 3 is viscous, it can happen that capillary 4, which would be used because of the small thermal volume expansion to be expected, is too thin for absorption liquid 3. In such a case a highly liquid medium 15 is poured on absorption liquid 3 whose specific weight is less than that of absorption liquid 3.

The increase of the rise can easily be read by eye, because the outflow of the fed heat and thus the lowering of the rise proceeds very slowly. But it is more convenient if the rise is automatically measured. For example, the capillary can be optically imaged on a CCD array, which is read out electronically, or the rise can be measured acoustically by a standing wave being produced in the air-filled part of capillary 4.

A drawback of the arrangement shown in FIG. 1 consists in the fact that the energy, which is conveyed on reflection cone 6 is not integrated in the measurement. This will have an effect, especially at higher energies.

Figure 2:
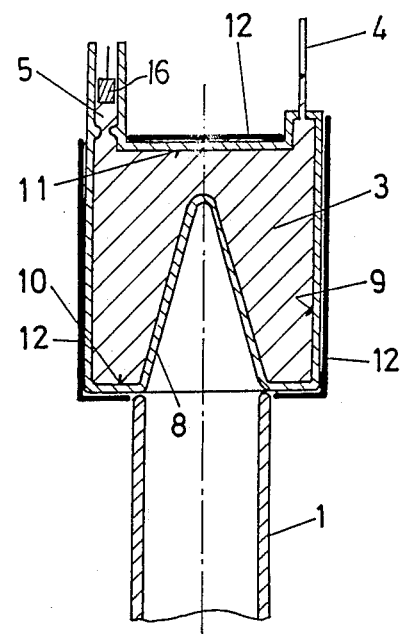
FIG. 2, an axial section through an arrangement with a container, in which the HF window is formed by a conical indentation, FIG. 3, an axial section through an arrangement with a container, in which the HF window is formed by an indentation with an M-shaped axial section, and FIG. 4, an arrangement for a rectangular waveguide.
Figure 3:
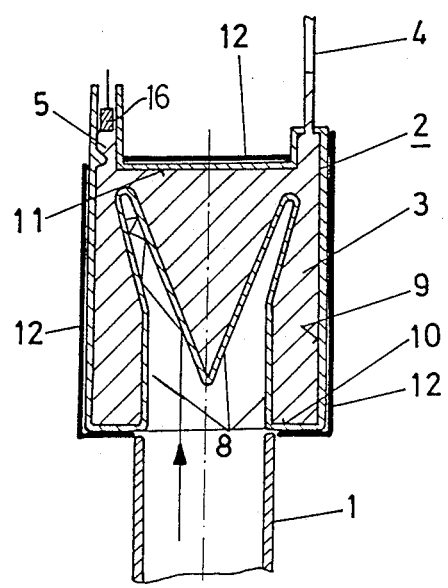

This drawback can be corrected if container 2 is shaped as shown in FIG. 2 or FIG. 3.

FIG. 2 shows an arrangement in which container 2 has a conical indentation at HF window. A volume of container 2 is defined by a cylindrical outside wall 9, an inside wall 8 that is conical in contrast with FIG. 1, a bottom 10 and a cover 11.

The microwave pulse irradiated from waveguide 1 slowly runs its course, its energy here too is distributed over the entire absorption liquid 3.

FIG. 3 shows another preferred embodiment of container 2. Outside wall 9, bottom 10 and cover 11 correspond to those of FIG. 2. An inside wall 8 is shaped so that it appears M-shaped in its axial section. A microwave pulse (see arrow), whose density of energy, for example at the half radius of waveguide 1, is maximum, is so absorbed that the energy in the shoulders of the M-shaped axial section dissipates.

The remaining elements identified in FIG. 2 and FIG. 3 (capillary 4, reflection layer 12, etc.) correspond to those already described and identified by the same names in FIG. 1. But the remaining parts shown in FIG. 1, which are not shown in FIG. 2 and FIG. 3, have their equivalents here, too.

Figure 4:
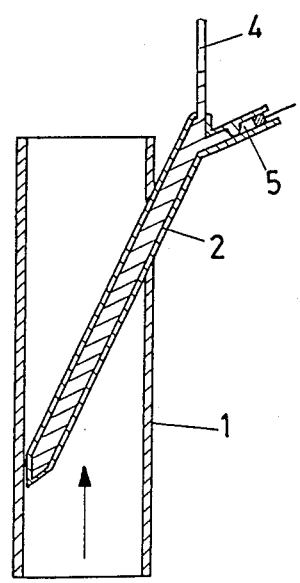

FIG. 4 shows an embodiment, which is suitable in connection with a rectangular waveguide. Container 2 is a pipe, which is inserted into waveguide 1 at an oblique angle. Capillary 4 and balancing volume 5 are attached to a part of the pipe projecting from waveguide 1.

The angle at which container 2 is to project into waveguide 1 can be seen, e.g., from the initially cited publication of Horst Groll.

In summary it can be said that the heart of the invention resides in the fact that the energy of a microwave pulse can be measured by the thermal volume expansion of an absorption liquid. The shape of container 2 and especially the shape of inside wall 8 acting as HF window is very important. For an optimal transmission it must be adjusted in each case to the microwave pulse or the directed mode of waveguide 1. In this sense the described embodiments are to be considered at indicative but not as comprehensive. In principle, the process according to the invention works with any container shape.

We claim:

1. An arrangement for measuring of pulse energy of a microwave pulse, comprising:
   a container filled with an absorption liquid;
   said container having at least one transparent HF window for microwaves;
   a capillary containing a highly liquid medium and connected to the container for measuring the volume expansion of the absorption liquid; wherein:
   a liquid rise in the capillary is indicated by said highly liquid medium, which is less dense than the absorption medium and which is poured onto the absorption medium.

2. Arrangement according to claim 1, comprising:
   cooling means for keeping the absorption liquid as a whole at a basically constant working temperature.

3. Arrangement according to claim 2, wherein the working temperature corresponds to the ambient temperature.

4. Arrangement according to claim 1, wherein the container has volume which is so great that the increase of the heat content can result in an only insignificant increase of the working temperature.

5. Arrangement according to claim 1, wherein the container is connected to a balancing volume having a piston so that the height of the absorption liquid in the capillary can be adjusted by adjusting the position of the piston in the balancing volume.

6. Arrangement according to claim 5, wherein:
   the container has the shape of a cylindrical jacket which is placed on one end of a wave guide coaxial with it;
   the transparent HF window is a cylindrical inside wall of the container; and further comprising:
   a reflection cone which disperses the microwave pulse radially so that the energy is distributed over the volume of the container,
   said reflectin cone comprising two stages and having an angle of inclination greater at its pointed end than at its base end.

7. Arrangement according to claim 1, wherein the absorption liquid is a nongassing oil.

8. Arrangement according to claim 1, wherein:
   the container has the shape of a cylindrical jacket which is placed on one end of a wave guide coaxial with it;
   the transparent HF window is an inside wall of the container, which inside wall is M-shaped in axial section.

9. Arrangement according to claim 1, wherein the diameter of the inside wall corresponds to the diameter of the waveguide.

* * * * *